(12) United States Patent
Hong

(10) Patent No.: US 7,368,397 B2
(45) Date of Patent: May 6, 2008

(54) METHOD FOR MONITORING EDGE BEAD REMOVAL PROCESS OF COPPER METAL INTERCONNECTION

(75) Inventor: Ji Ho Hong, Suwon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/646,836

(22) Filed: Dec. 27, 2006

(65) Prior Publication Data

US 2007/0151946 A1    Jul. 5, 2007

(30) Foreign Application Priority Data

Dec. 29, 2005    (KR) .................. 10-2005-0134236

(51) Int. Cl.
*H01L 21/302*    (2006.01)
(52) U.S. Cl. .................. 438/745; 438/8; 438/754; 134/1.1; 134/1.2
(58) Field of Classification Search .................. 438/8, 438/692, 693, 745, 750, 754; 134/1.2
See application file for complete search history.

(56) References Cited

U.S. PATENT DOCUMENTS

| 6,494,219 | B1 * | 12/2002 | Nayak et al. | .............. 134/56 R |
| 7,196,782 | B2 * | 3/2007 | Fielden et al. | ............... 356/72 |
| 2006/0094136 | A1 * | 5/2006 | Borden et al. | ................ 438/16 |

\* cited by examiner

*Primary Examiner*—Lan Vinh
(74) *Attorney, Agent, or Firm*—Andrew D. Fortney

(57) ABSTRACT

Disclosed is a method for monitoring an edge bead removal process for a copper metal interconnection. The method includes the steps of (a) forming a copper metal layer on a semiconductor wafer, (b) performing the edge bead removal (EBR) process of removing the copper metal layer formed in an edge area of the semiconductor wafer, and (c) determining whether copper residues exist by measuring a reflection coefficient Rc of the copper metal layer formed in a center area of the semiconductor wafer and a reflection coefficient (Rb) in the edge area of the semiconductor wafer which is subject to the edge bead removal (EBR) process.

19 Claims, 2 Drawing Sheets

METHOD FOR MONITORING EDGE BEAD REMOVAL PROCESS OF COPPER METAL INTERCONNECTION

BACKGROUND OF THE INVENTION

1. Field of the Invention

The present invention relates to a method for forming a metal interconnection in a semiconductor device. More particularly, the present invention relates to an edge bead removal process for a copper metal interconnection.

2. Description of the Related Art

Semiconductor manufacturing processes are mainly classified into a front end of the line (FEOL) process for forming a transistor on a silicon substrate, and a back end of the line (BEOL) process for forming metal interconnections. The BEOL process refers to a process of forming power supply and signal transfer paths on a silicon substrate to connect transistors to each other so as to constitute integrated circuits.

Copper (Cu), which is a material having high EM (Electro-migration) tolerance, has been mainly used for such a BEOL process. However, since the copper (Cu) is not easily etched, but is oxidized during the interconnection process, it is difficult to pattern the copper (Cu) by employing a typical photo process technology.

In order to form a copper metal interconnection, a dual damascene process technology has been developed as an alternative plane of the photo technology. The dual damascene process is to form a via and a trench in an inter-layer dielectric layer formed on a semiconductor substrate, fill the via and trench with copper (Cu) through an electro-chemical plating (ECP) scheme, and then planarize the upper surface of a semiconductor substrate through a chemical mechanical polishing (CMP) process.

Meanwhile, if an edge part of a wafer is not properly treated during the BEOL process in which a metal process and an insulating layer forming process are repeated, defects may occur on the wafer in following processes. Accordingly, after performing the ECP process, an edge bead removal (EBR) process is performed to remove a copper plating layer formed in the edge part of the wafer by using a predetermined chemical agent. If the wafer is not subject to the EBR process, an unnecessary copper plating layer formed in the edge part of the wafer (an edge part, in which a pattern is not formed, is generally called a bevel area) may be released during the following process. In addition, since the released copper residue deteriorates equipment for following processes, the yield rate and the performance of the semiconductor device may be degraded.

However, since there is no special tester capable of determining whether the EBR process is normally performed, the next process is directly performed without a special test after performing the EBR process. Accordingly, if the density of the chemical agent used in the EBR process is abnormal, or if the EBR process is not normally performed due to the fail of the equipment or the mistake of a worker, a portion of the unnecessary copper layer may remain in the edge part of the wafer. Accordingly, since the following processes are performed with respect to the wafer having a defect, the yield rate and the performance of a semiconductor device may be degraded.

SUMMARY OF THE INVENTION

Accordingly, the present invention has been made to solve the above-mentioned problems, and an object of the present invention is to provide a method for monitoring an EBR process, capable of determining whether copper residues exist after performing the EBR process.

In order to accomplish the object of the present invention, there is provided a method for monitoring an edge bead removal (EBR) process of a copper metal interconnection, including the steps of, (a) forming a copper metal layer on a semiconductor wafer, (b) performing the edge bead removal (EBR) process of removing the copper metal layer formed in an edge area of the semiconductor wafer, and (c) determining whether copper residues exist by measuring a reflection coefficient Rc of the copper metal layer formed in a center area of the semiconductor wafer and a reflection coefficient (Rb) in the edge area of the semiconductor wafer which is subject to the edge bead removal (EBR) process.

Preferably, in step (c), the reflection coefficient Rb is continuously measured along the edge area of the semiconductor wafer, and the variation $\Delta R$ of difference Rc–Rb of the reflection coefficient RC and the reflection coefficient Rb is measured.

DETAILED DESCRIPTION OF THE INVENTION

Hereinafter, preferred embodiments of a method for monitoring an EBR process according to the present invention will be described with reference to accompanying drawings.

Figure 1A:
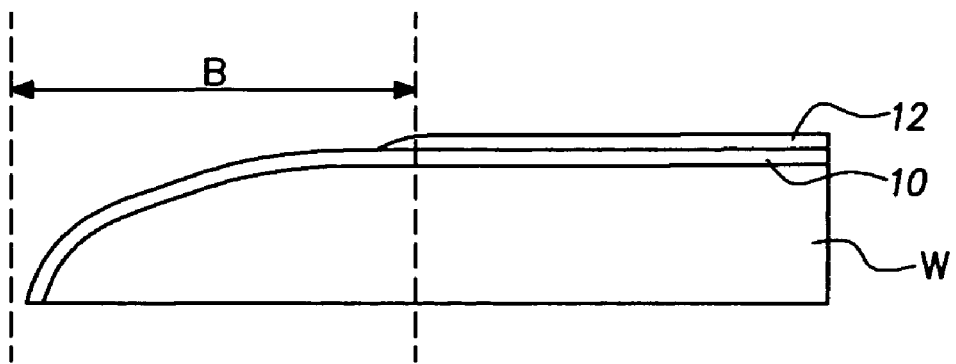
FIGS. 1A to 1D are views showing an edge bead removal (EBR) process with respect to a copper metal interconnection.

As shown in FIG. 1A, a tantalum (Ta) layer, or a tantalum nitride (TaN) layer serving as a barrier metal layer 10 in a damascene process is formed on a semiconductor wafer. Then, a copper seed layer 12 is formed on the barrier metal layer 10.

Figure 1B:
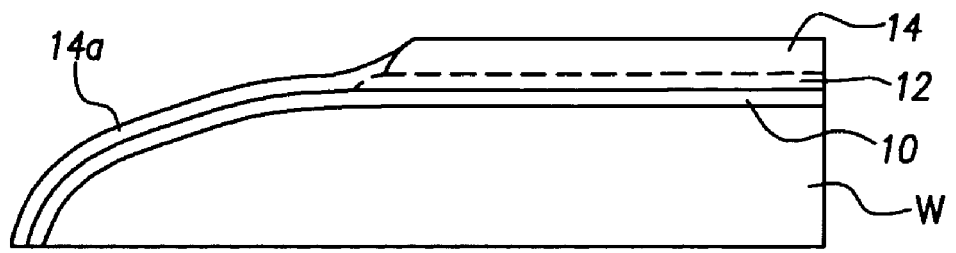
Figure 1C:
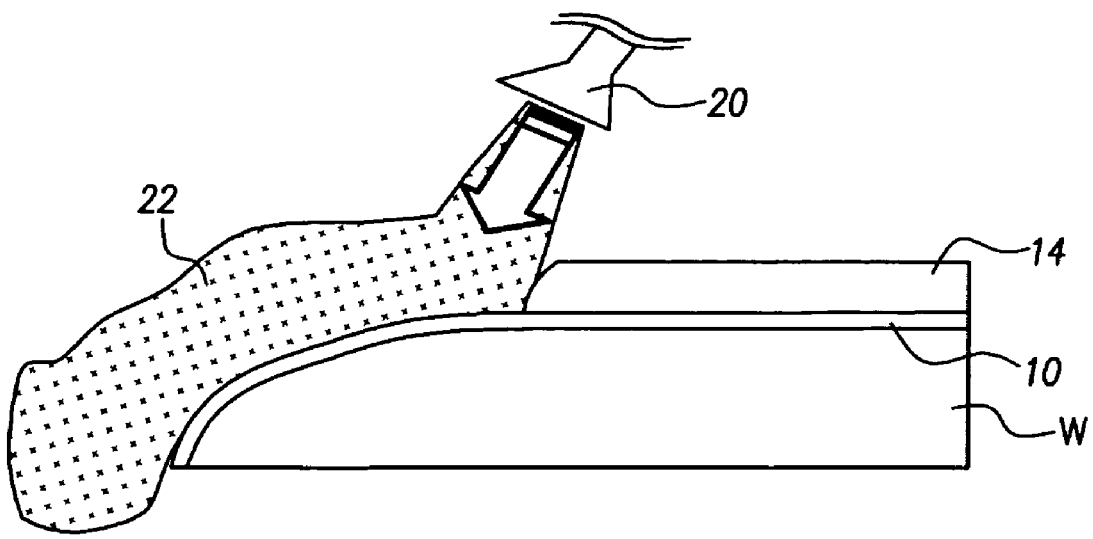
Figure 1D:
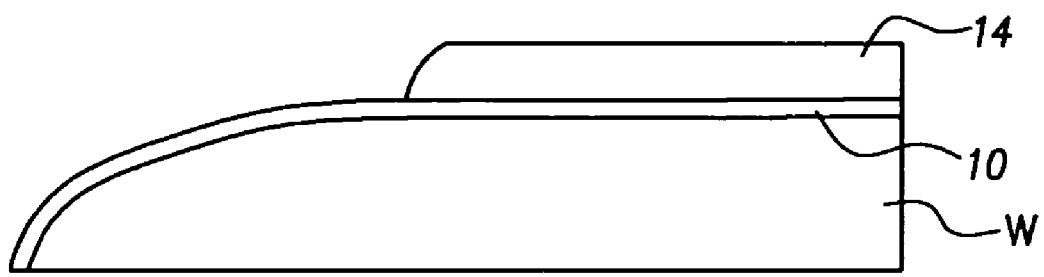

As shown in FIG. 1B, a copper plating layer 14 is formed on the copper seed layer 12 through an electrical-chemical plating scheme. At this time, a portion of the copper metal layer may be formed even in an edge area (B) of the wafer. As shown in FIG. 1C, in order to remove an unnecessary copper metal layer 14a, an EBR process is performed with respect to the copper metal layer. The EBR process may be performed by using a chemical cleaning agent. In this case, a chemical cleaning agent 22 including sulfuric acid ($H_2SO_4$), oxygenated water ($H_2O_2$), and deionized water is selectively sprayed only on the edge area (B) through a nozzle 20 provided above the edge area (B) of the wafer. If the wafer is subject to such an EBR process, the copper metal layer 14a formed on the edge area of the wafer may be removed as shown in FIG. 1D.

However, although the wafer is subject to the EBR process, copper residues may remain. The copper residues existing in the edge area (B) of the wafer can be detected as follows.

Figure 2:
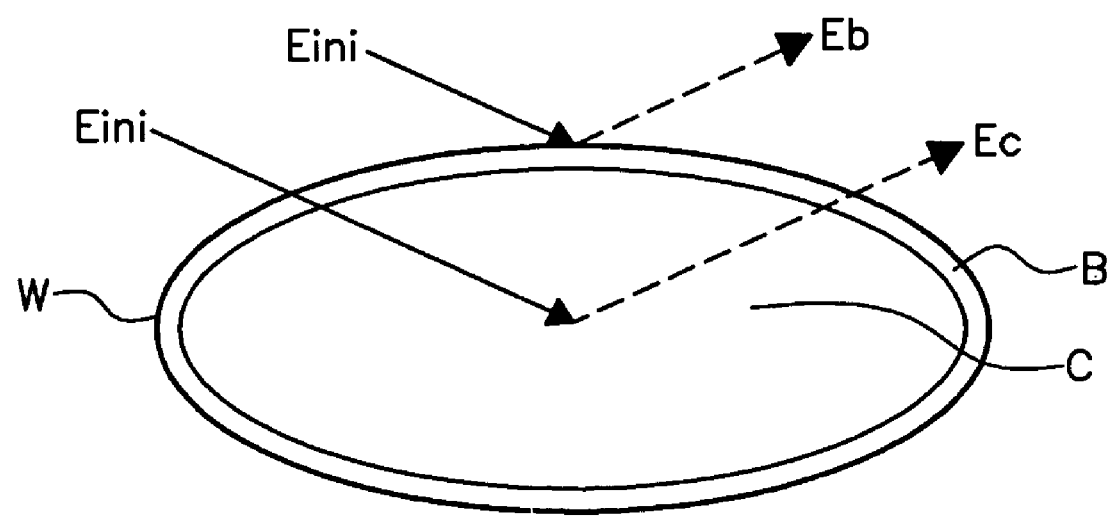
FIG. 2 is a view showing a method for monitoring whether copper residues exist after performing an EBR process.

Referring to FIG. 2, a desired copper metal layer is formed in the center area (c) of the wafer (W), and an unnecessary copper layer is removed from an edge area (B) of the wafer (W) through the EBR process such that a substrate or a barrier metal layer can be exposed.

In general, a reflection coefficient implicates a ratio of the energy of reflected light to the energy of incident light in a unit area. In other words, on the assumption that the energy of light incident on a unit area in the first stage and the energy of light reflected from a unit area correspond to "Eini" and "Eref", respectively, the reflection coefficient (R) may be represented as "Eref/Eini".

The reflection coefficient may be measured by using a reflectometer, or an existing optical device.

Since the reflection coefficient represents an intrinsic characteristic of a material, a reflection coefficient (Rc) of a copper metal layer formed at the center area (C) of the wafer differs from a reflection coefficient (Rb) of a silicon substrate, or a barrier metal layer exposed through the EBR process.

As shown in FIG. 2, on the assumption that the energy of light, which is reflected from the wafer center area (C), per a unit area corresponds to "Ec", and the energy of light, which is reflected from the wafer edge area (B), per a unit area corresponds to "Eb", a reflection coefficient (Rc) in the wafer center area (C) may be represented as "Ec/Eini", and a reflection coefficient (Rb) in the wafer border area (B) may be represented as "Eb/Eini".

If the EBR process is normally performed, difference between the RC and the Rb may is constant.

However, if the copper metal layer is not removed, but remains, the Rb approximates to the Rc.

Accordingly, if the difference between the Rb and the Rc is measured while measuring the Rb along the wafer edge area (B), it can be determined whether the copper metal layer is completely removed through the EBR process.

In other words, if the variation ($\Delta R$) of the difference (Rc−Rb) between the Rb and the Rc is measured, it can be determined whether copper residues exist in the wafer edge area (B).

In detail, the reflection coefficient (Rb) is measured along the wafer edge area (B) so that the difference between the Rc and the Rb is monitored. On the assumption that the difference between the Rc and the Rb is R1, if the EBR process is normally performed, differences between the Rc and the Rb in the entire edge area (B) become the same value R1.

However, if copper residues remain in a specific area, the difference between the Rc and the Rb is approximately convergent to "0", and it can be determined that copper residues remain in the area.

In this case, the EBR process is performed with respect to the specific area, thereby completely removing the copper residues exerting an influence on following processes.

According to the present invention, a simple optical device may be employed in order to determine whether an EBR process of removing an undesired copper plating layer formed in the wafer edge area having no pattern is normally performed.

As described above, according to the present invention, since copper residues exerting an influence on a following process are completely removed from the wafer edge area, the yield rate and the performance of a semiconductor device can be improved.

It will be apparent to those skilled in the art that various modifications and variations can be made in the present invention. Thus, it is intended that the present invention covers the modifications and variations thereof within the scope of the appended claims.

What is claimed is:

1. A method for monitoring an edge bead removal (EBR) process of a copper metal interconnection, the method comprising the steps of:
   (a) forming a copper metal layer on a semiconductor wafer;
   (b) performing the edge bead removal (EBR) process of removing the copper metal layer in an edge area of the semiconductor wafer; and
   (c) measuring a first reflection coefficient of the copper metal layer in a center area of the semiconductor wafer;
   (d) measuring a second reflection coefficient in the edge area of the semiconductor wafer subject to the edge bead removal (EBR) process; and
   (e) determining whether copper residues exist in the edge area by evaluating the first and second reflection coefficients.

2. The method as claimed in claim 1, wherein, in step (d), the second reflection coefficient is continuously measured along the edge area of the semiconductor wafer.

3. The method as claimed in claim 1, further comprising determining a variation $\Delta R$ of the difference between the first and second reflection coefficients.

4. The method as claimed in claim 1, wherein the edge bead removal (EBR) process comprises treating the edge area of the semiconductor wafer with a wet cleaning agent selected from the group consisting of sulfuric acid ($H_2SO_4$), hydrogen peroxide ($H_2O_2$), and deionized water.

5. The method as claimed in claim 4, wherein the wet cleaning agent comprises sulfuric acid ($H_2SO_4$).

6. The method as claimed in claim 4, wherein the wet cleaning agent comprises hydrogen peroxide ($H_2O_2$).

7. The method as claimed in claim 4, wherein the wet cleaning agent comprises deionized water.

8. The method as claimed in claim 1, wherein the edge bead removal (EBR) process is performed as long as the first reflection coefficient equals the second reflection coefficient.

9. The method as claimed in claim 8, further comprising stopping the edge bead removal (EBR) process when the second reflection coefficient is not substantially equal to the first reflection coefficient.

10. The method as claimed in claim 3, wherein the edge bead removal (EBR) process is performed as long as the difference between the first and second reflection coefficients is zero.

11. The method as claimed in claim 3, further comprising stopping the edge bead removal (EBR) process when the difference between the first and second reflection coefficients is not substantially zero.

12. The method as claimed in claim 3, further comprising stopping the edge bead removal (EBR) process when the difference between the first and second reflection coefficients is about one (1).

13. The method as claimed in claim 1, wherein the reflection coefficient is measured with an optical device.

14. The method as claimed in claim 1, wherein the reflection coefficient is measured with a reflectometer.

15. The method as claimed in claim 8, wherein the second reflection coefficient is continuously measured along the edge area of the semiconductor wafer.

16. The method as claimed in claim 8, further comprising determining a variation $\Delta R$ of the difference between the first and second reflection coefficients.

17. The method as claimed in claim 8, wherein the edge bead removal (EBR) process comprises treating the edge area of the semiconductor wafer with a wet cleaning agent selected from the group consisting of sulfuric acid ($H_2SO_4$), hydrogen peroxide ($H_2O_2$), and deionized water.

18. The method as claimed in claim 8, wherein the reflection coefficient is measured with an optical device.

19. The method as claimed in claim 8, wherein the reflection coefficient is measured with a reflectometer.

* * * * *